(12) United States Patent
Koh et al.

(10) Patent No.: US 12,159,563 B2
(45) Date of Patent: Dec. 3, 2024

(54) DISPLAY DEVICE AND METHOD FOR DRIVING DISPLAY DEVICE

(71) Applicant: Samsung Display Co., LTD., Yongin-si (KR)

(72) Inventors: Jae Hyun Koh, Yongin-si (KR); Seok Young Yoon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/330,610

(22) Filed: Jun. 7, 2023

(65) Prior Publication Data

US 2024/0078947 A1     Mar. 7, 2024

(30) Foreign Application Priority Data

Sep. 6, 2022   (KR) .................. 10-2022-0113096

(51) Int. Cl.
    *G09G 3/20*        (2006.01)
    *H05K 1/18*        (2006.01)
    *H05K 1/14*        (2006.01)

(52) U.S. Cl.
CPC .............. *G09G 3/20* (2013.01); *H05K 1/189* (2013.01); *G09G 2300/0842* (2013.01); *G09G 2330/021* (2013.01); *H05K 1/148* (2013.01); *H05K 2201/049* (2013.01); *H05K 2201/10151* (2013.01); *H05K 2201/10196* (2013.01)

(58) Field of Classification Search
CPC .......... H05K 2201/10128; H05K 2201/10136; H05K 2201/10196; H05K 1/148; H05K 1/189; H05K 2201/049; H05K 2201/10151; H10K 59/00–95; G05F 1/575; G05F 3/262; H02J 7/0048; H02J 7/005; H02J 7/0016; G09G 2300/0842; G09G 2330/021; G09G 3/20; G09G 2330/028; H02M 3/156; H02M 1/0058; H02M 3/1582; H02M 1/08; H02M 1/0083; H02M 1/0006; H02M 1/00; H02M 3/158; G09F 9/301; H05B 45/60; H05B 45/46; H05B 45/347

See application file for complete search history.

(56) References Cited

U.S. PATENT DOCUMENTS

| | | | |
|---|---|---|---|
| 7,403,181 B2 | 7/2008 | Moon | |
| 9,666,128 B2 | 5/2017 | Jeong | |
| 10,049,618 B2 | 8/2018 | Jeong | |
| 10,699,636 B2 | 6/2020 | You et al. | |

(Continued)

FOREIGN PATENT DOCUMENTS

| | | |
|---|---|---|
| KR | 10-0796792 | 1/2008 |
| KR | 10-2016-0074762 | 6/2016 |

(Continued)

*Primary Examiner* — Sanjiv D. Patel
(74) *Attorney, Agent, or Firm* — KILE PARK REED & HOUTTEMAN PLLC

(57) ABSTRACT

A display device includes a display panel. Circuit boards include power lines electrically connected to the display panel. A power supply supplies a power voltage to the display panel through the power lines. A resistance adjuster is disposed on at least one of the circuit boards, and adjusts a resistance of at least one power line among the power lines such that a current deviation between the power lines is within a reference range.

20 Claims, 13 Drawing Sheets

(56) References Cited

U.S. PATENT DOCUMENTS

| | | | | |
|---|---|---|---|---|
| 2009/0116223 A1* | 5/2009 | Hamada | ............... | G02B 6/0068 |
| | | | | 362/249.02 |
| 2013/0249420 A1* | 9/2013 | Lee | ........................ | H05B 45/46 |
| | | | | 315/192 |
| 2014/0292739 A1* | 10/2014 | Kim | ..................... | G09G 3/3225 |
| | | | | 345/212 |
| 2015/0245433 A1* | 8/2015 | McCune, Jr. | .......... | H05B 45/50 |
| | | | | 315/294 |
| 2015/0289336 A1* | 10/2015 | Cho | ........................ | H05B 45/14 |
| | | | | 315/192 |
| 2022/0180799 A1* | 6/2022 | Zheng | ..................... | G09G 5/10 |

FOREIGN PATENT DOCUMENTS

| | | |
|---|---|---|
| KR | 10-1958449 | 3/2019 |
| KR | 10-2019-0100549 | 8/2019 |
| KR | 10-2306070 | 9/2021 |

\* cited by examiner

DISPLAY DEVICE AND METHOD FOR DRIVING DISPLAY DEVICE

CROSS-REFERENCE TO RELATED APPLICATION

This application claims priority to and benefits of Korean patent application No. 10-2022-0113096 under 35 U.S.C. § 119(a), filed on Sep. 6, 2022, in the Korean Intellectual Property Office (KIPO), the entire disclosure of which is incorporated herein by reference.

BACKGROUND

1. Technical Field

The disclosure generally relates to a display device and a method for driving a display device.

2. Description of the Related Art

As interest in information displays and demand for portable information media increase, research and commercialization has focused on display devices.

A display device includes a display panel for displaying an image and a power supply for providing a power voltage and a driving current to the display panel. The power supply is disposed on a circuit board. The display panel and the circuit board are connected to each other through flexible circuit boards. The power supply may supply the power voltage to the display panel through the flexible circuit boards.

Resistance between the circuit board and a connection circuit boards may become different from each other in a manufacturing process (e.g., due to a process variation), and resistances between the display panel and the flexible circuit boards may also become different from each other in the manufacturing process. According to the difference between the resistances, a difference may occur in a level of the power voltage and/or a current amount of the driving current, provided to the display panel through the flexible circuit boards, for each area of the display panel. For example, a transient current may be provided to a specific area of the display panel through a specific flexible circuit board (i.e., a current biased phenomenon may occur), and heat generation and/or burnt defects may occur.

SUMMARY

Embodiments provide a display device and a method for driving a display device, which can provide a uniform driving current to areas of a display panel.

In accordance with an aspect of the disclosure, there is provided a display device including a display panel including pixels; circuit boards including power lines electrically connected to the display panel; a power supply that supplies a power voltage to the display panel through the power lines; and a resistance adjuster disposed on at least one of the circuit boards, the resistance adjuster adjusting a resistance of at least one power line among the power lines such that a current deviation between the power lines is within a reference range.

The resistance adjuster may include a sensing block that measures a current flowing through the at least one power line; and a variable resistance block that adjusts the resistance of the at least one power line.

The sensing block may include a shunt resistor.

The variable resistance block may include a digital variable resistor.

The display device may further include a power controller that calculates the current deviation between the power lines, based on the current measured by the sensing block, and calculate a resistance value of each of the power lines such that the current deviation is within the reference range. The resistance adjuster may adjust the resistance, based on the resistance value.

The circuit boards may include a printed circuit board and flexible films electrically connected between the printed circuit board and the display panel. The resistance adjuster may be disposed on at least one of the flexible films.

The power lines disposed on the flexible films may be divided into groups. The resistance adjuster may measure a current for each of the groups and adjust the resistance for each of the groups.

The resistance adjuster may adjust each of resistances of the power lines included in one group among the groups, based on one control signal with respect to the one group.

The circuit boards may include a printed circuit board and flexible films electrically connected between the printed circuit board and the display panel. The resistance adjuster may be disposed on the printed circuit board.

The resistance adjuster may adjust the resistance in initial driving of the display device.

The display device may further include a power controller that detects a pattern in which the current deviation becomes large, based on image data, and to control the resistance adjuster to adjust the resistance, based on the pattern.

The resistance adjuster may periodically adjust the resistance during driving of the display device.

In accordance with an aspect of the disclosure, there is provided a method for driving a display device, the method including sensing a current flowing through at least one power line among power lines disposed on circuit boards between a power supply and a display panel; calculating a current deviation between power lines, based on the sensed current; and adjusting a resistance of the at least one power line among the power lines such that the current deviation is within a reference range.

The method may further include re-sensing a current flowing through the at least one power line among the power lines, after the adjusting of the resistance.

The power lines disposed on flexible films between the power supply and the display panel may be divided into groups. The sensing of the current may include sensing the current for each of the groups.

In the sensing of the current, the current may be sensed in initial driving of the display device.

The method may further include detecting a pattern in which the current deviation becomes larger than the reference range, based on image data; and adjusting the resistance, based on the pattern.

The method may further include periodically repeating the sensing of the current, the calculating of the current deviation, and the adjusting of the resistance.

The adjusting of the resistance of the at least one power line among the power lines may include measuring a current for each of the groups.

The adjusting of the resistance of the at least one power line among the power lines may further include adjusting each of resistances of the power lines included in one group among the groups, based on one control signal with respect to the one group.

BRIEF DESCRIPTION OF THE DRAWINGS

Example embodiments will now be described more fully hereinafter with reference to the accompanying drawings;

however, they may be embodied in different forms and should not be construed as limited to the embodiments set forth herein. Rather, these embodiments are provided so that this disclosure will be more thorough and complete, and will convey the scope of the example embodiments to those skilled in the art.

Figure 1:
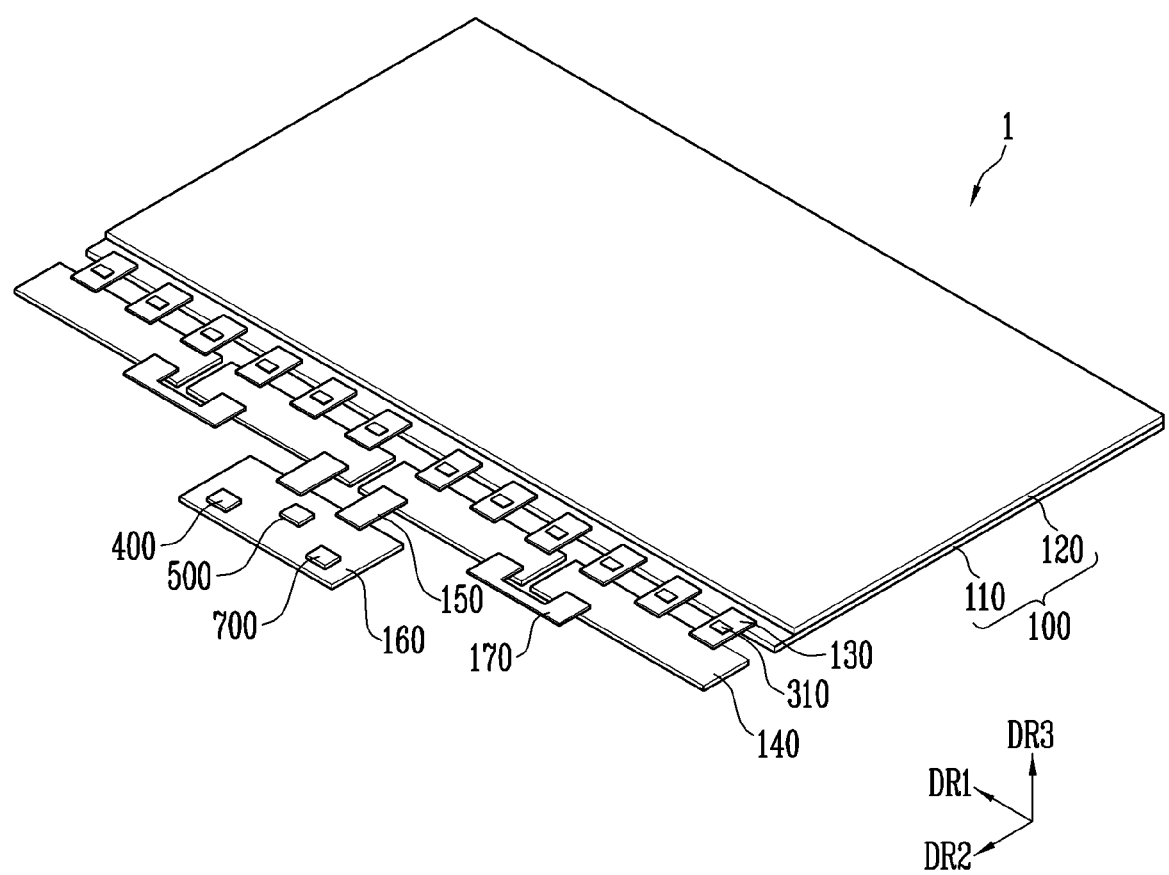

In the drawing figures, dimensions may be exaggerated for clarity of illustration. It will be understood that when an element is referred to as being "between" two elements, it can be the only element between the two elements, or one or more intervening elements may also be present. Like reference numerals and/or reference characters refer to like elements throughout.

FIG. 1 is a perspective view schematically illustrating a display device in accordance with embodiments of the disclosure.

Figure 2:
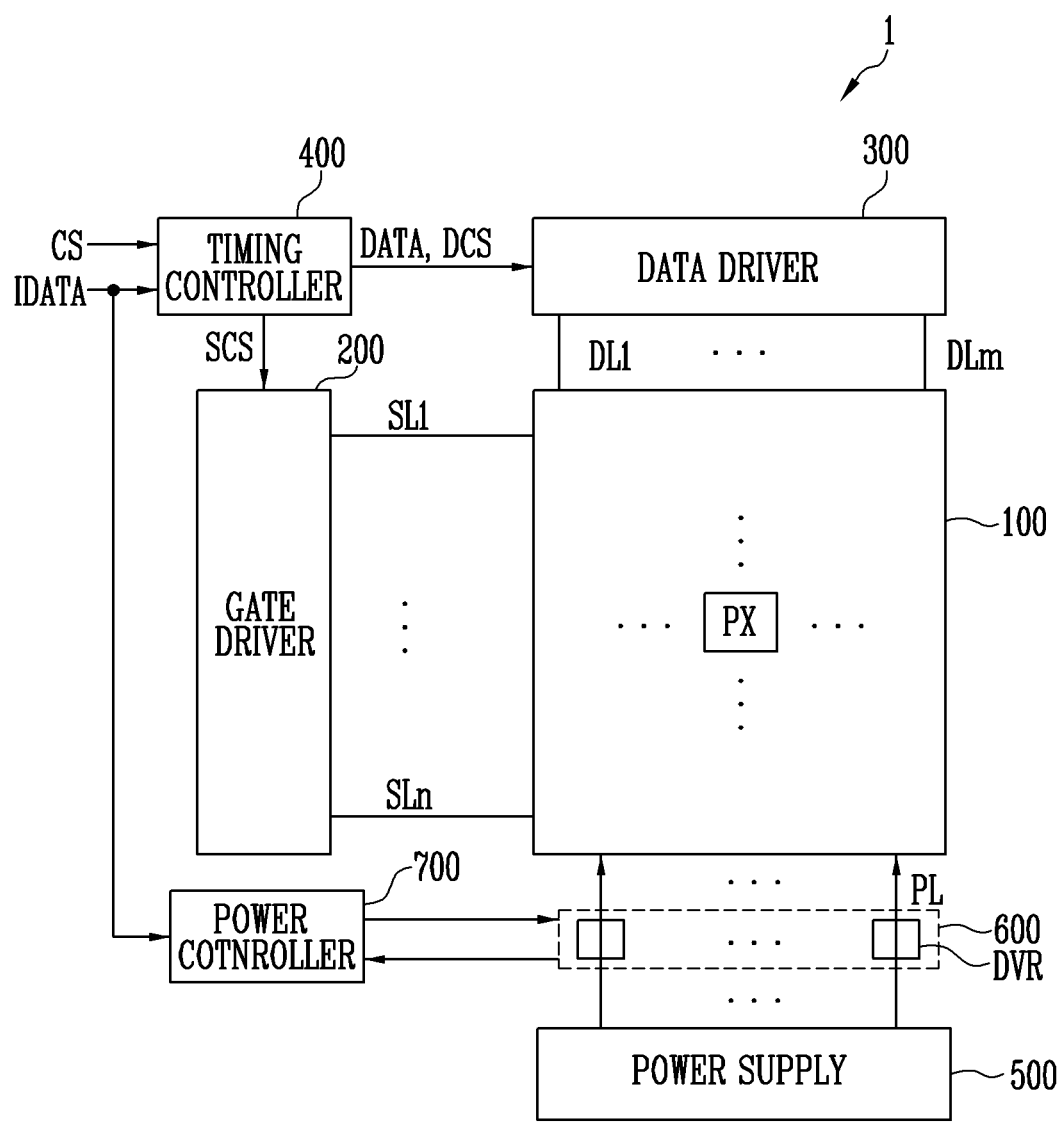

FIG. 2 is a block diagram schematically illustrating an embodiment of the display device shown in FIG. 1.

Figure 3:
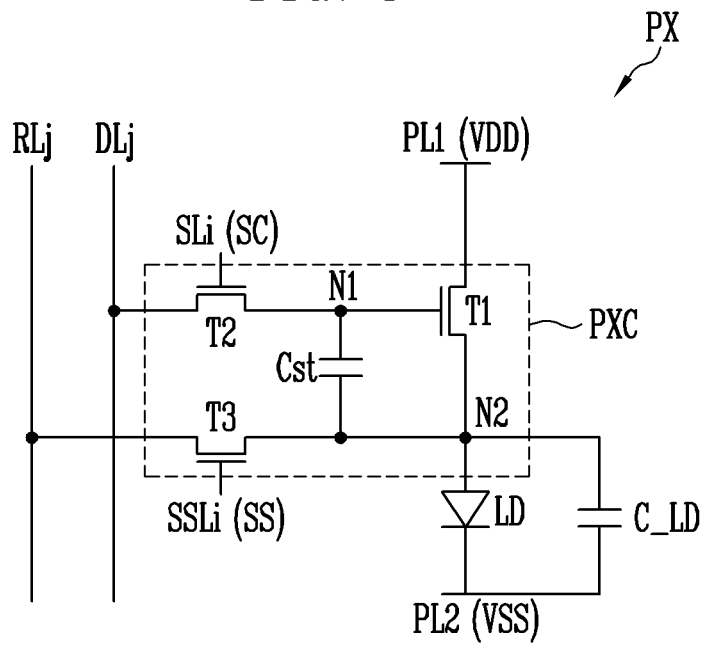

FIG. 3 is a schematic diagram of an equivalent circuit illustrating an embodiment of a pixel included in the display device shown in FIG. 2.

Figure 4:
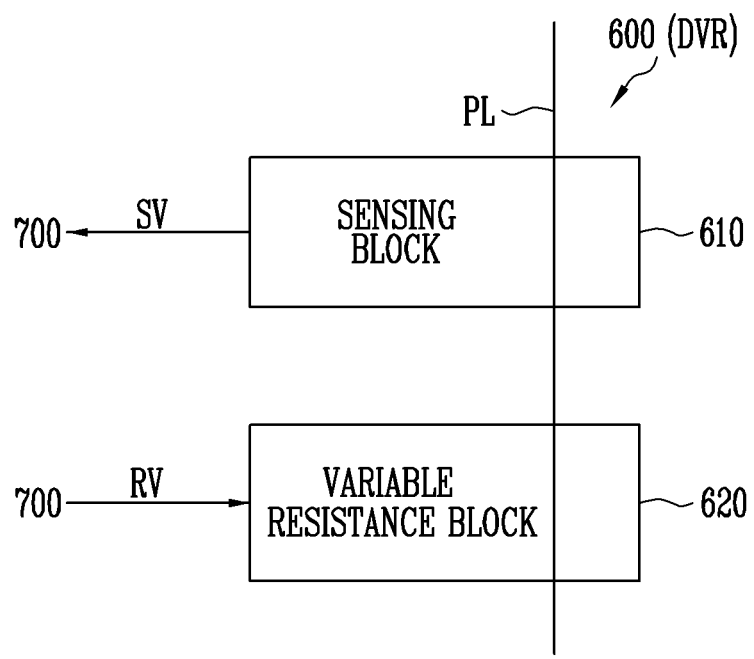

FIG. 4 is a block diagram schematic illustrating an embodiment of a resistance adjuster included in the display device shown in FIG. 2.

Figure 5:
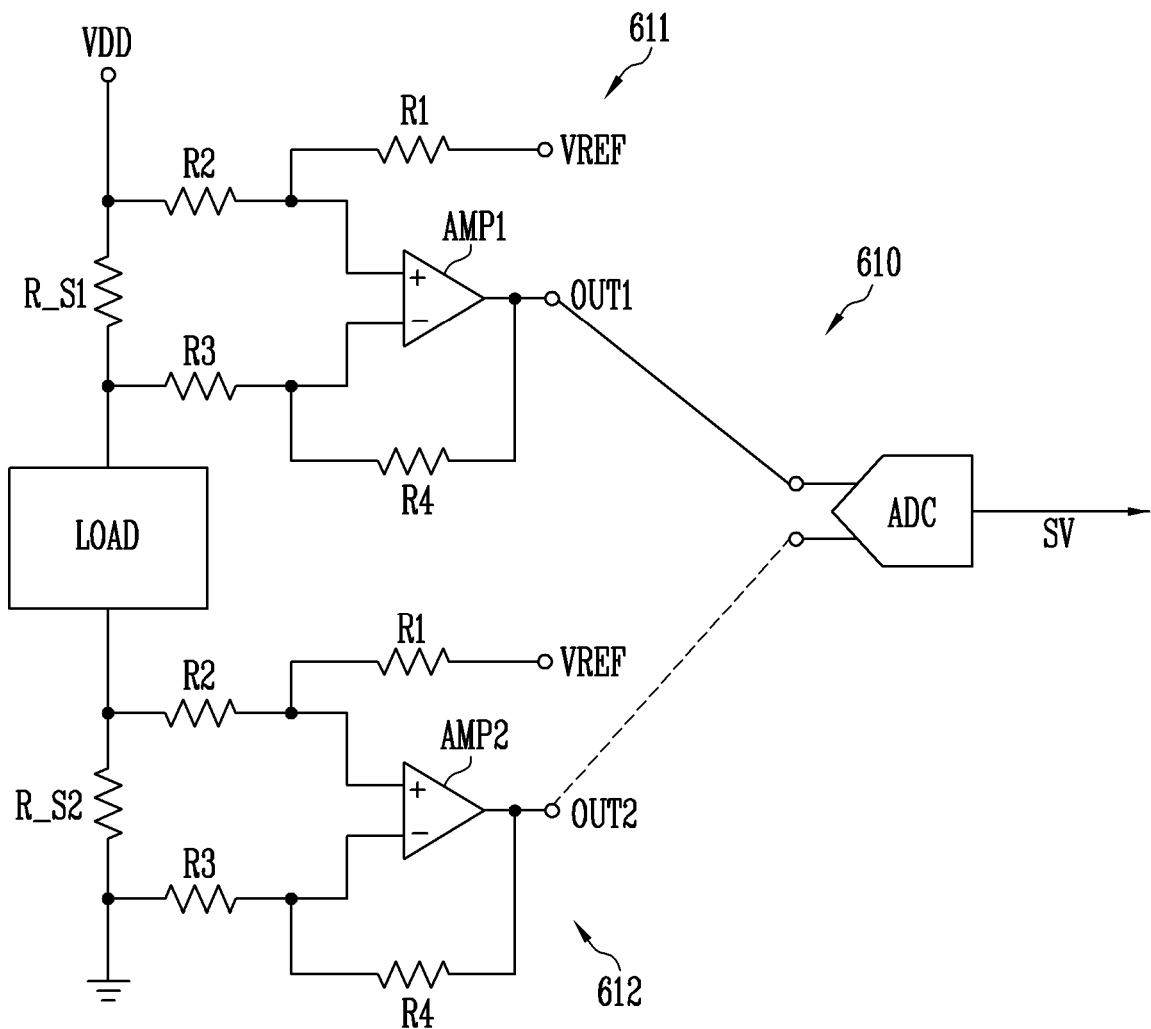

FIG. 5 is a schematic diagram of an equivalent circuit illustrating an embodiment of a sensing block included in the resistance adjuster shown in FIG. 4.

Figure 6:
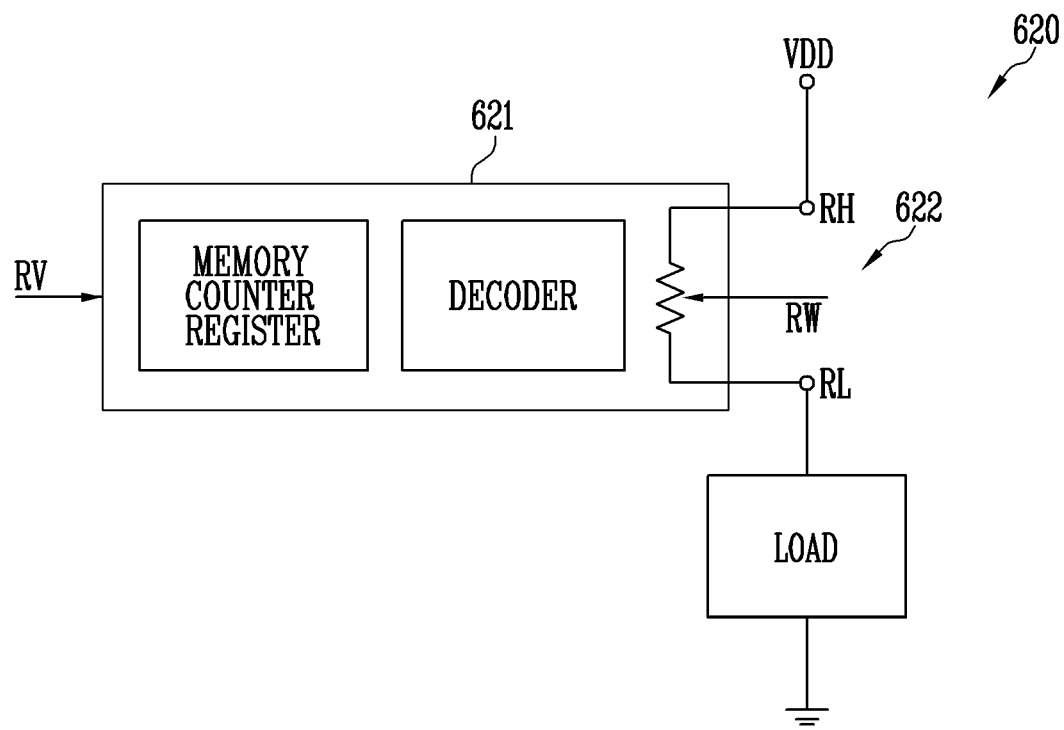

FIG. 6 is a diagram schematically illustrating an embodiment of a variable resistance block included in the resistance adjuster shown in FIG. 4.

Figure 7:
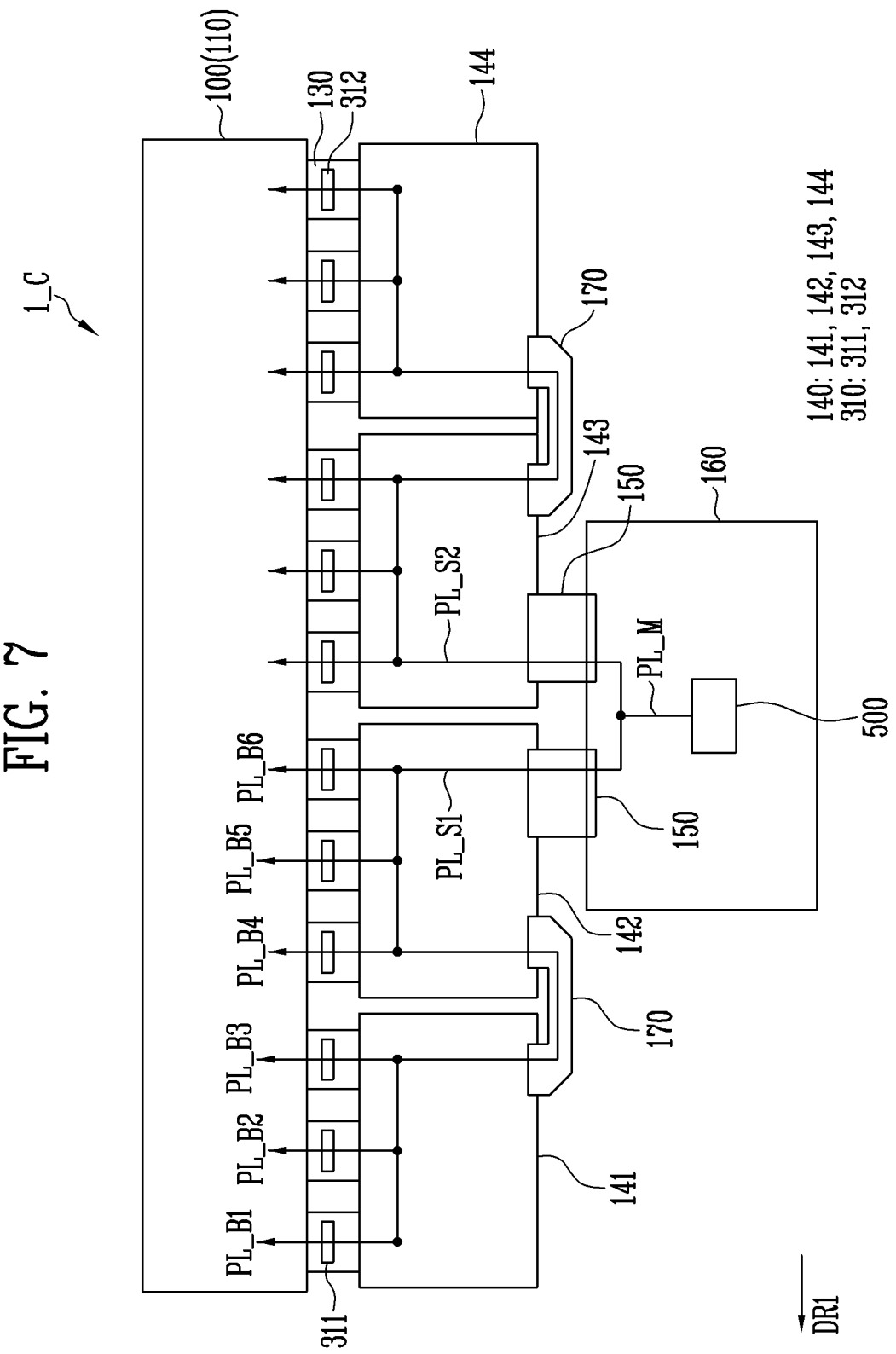

FIG. 7 is a schematic diagram illustrating a comparative embodiment of the display device shown in FIG. 1.

Figure 8:
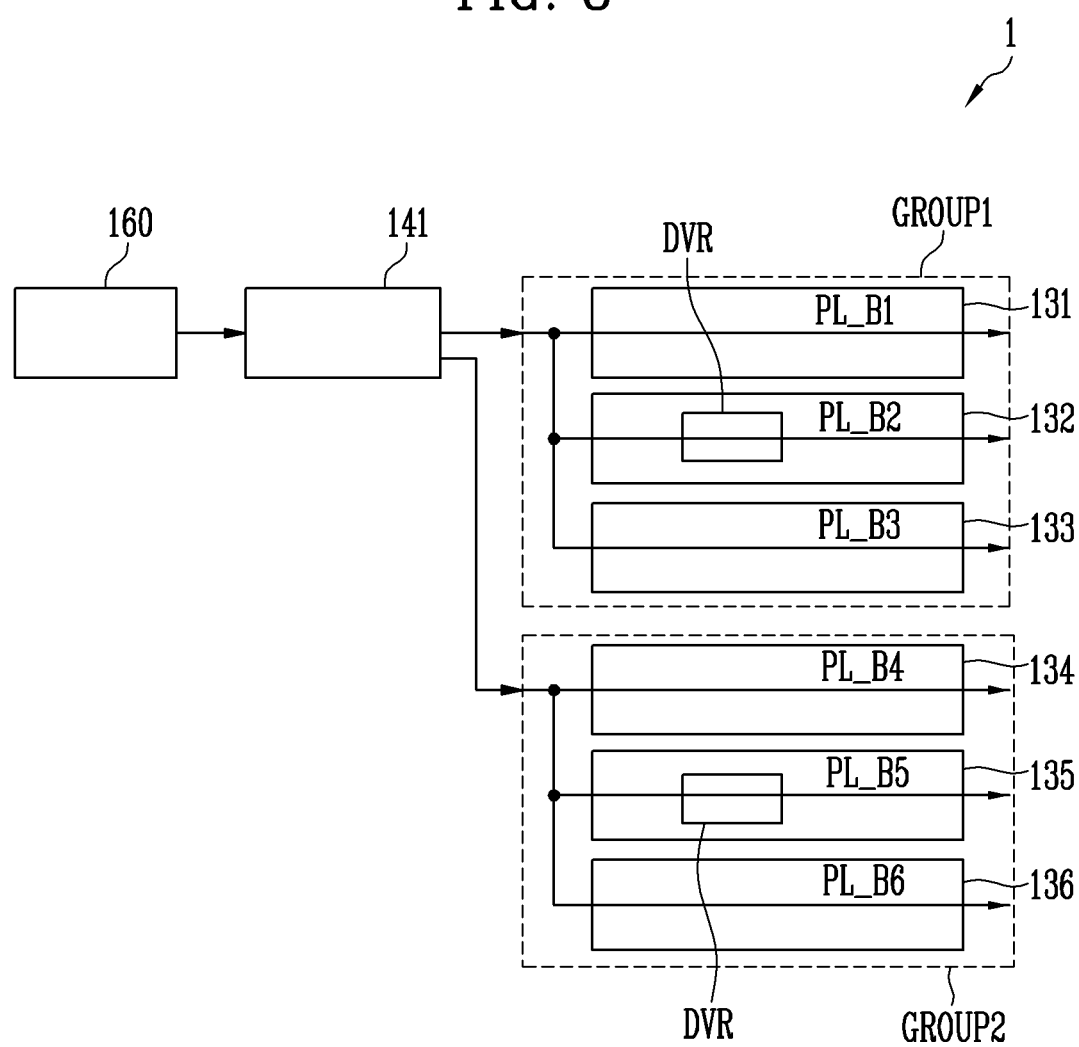
Figure 9:
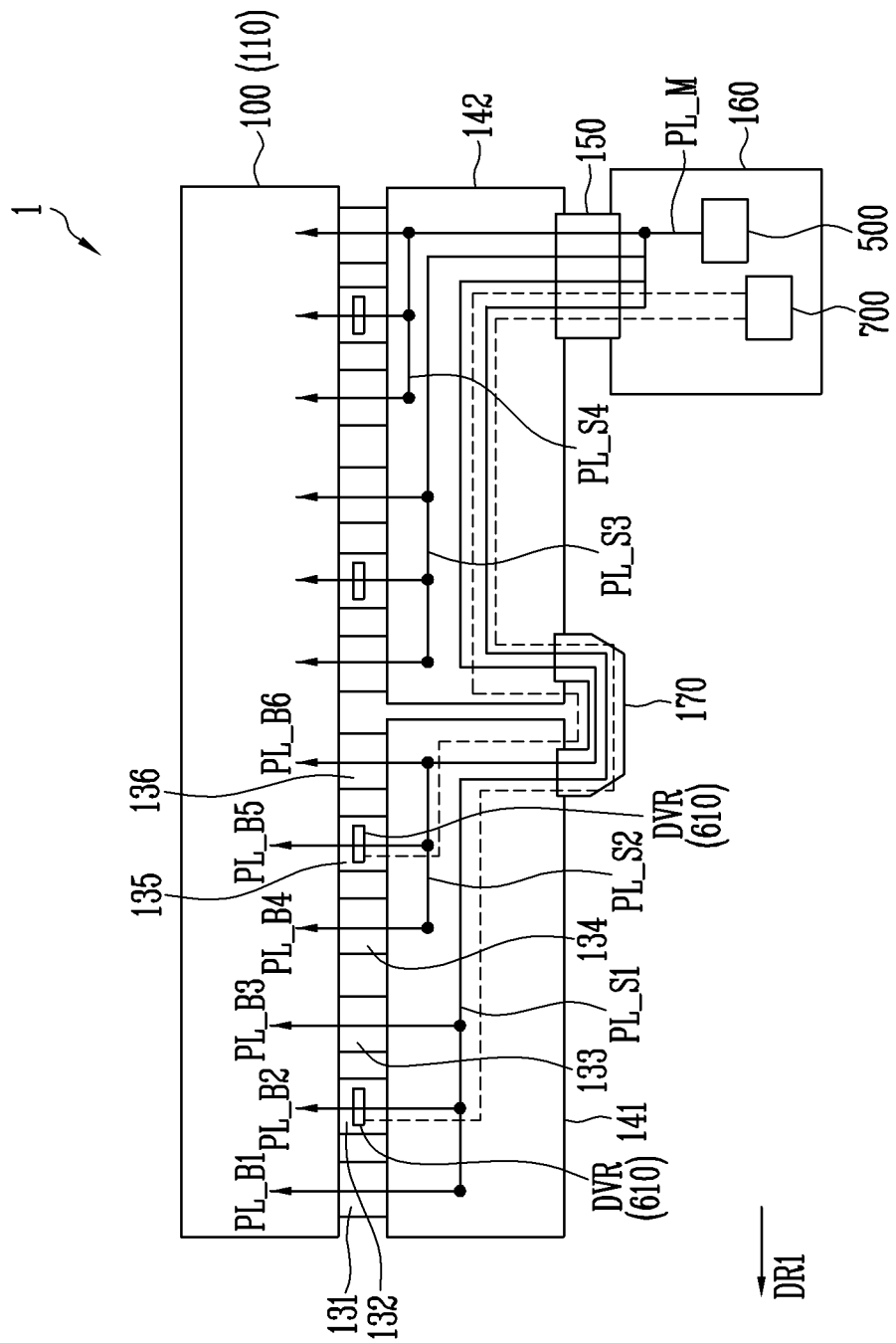

FIGS. 8 and 9 are diagrams schematically illustrating an embodiment of the display device shown in FIG. 1.

Figure 10:
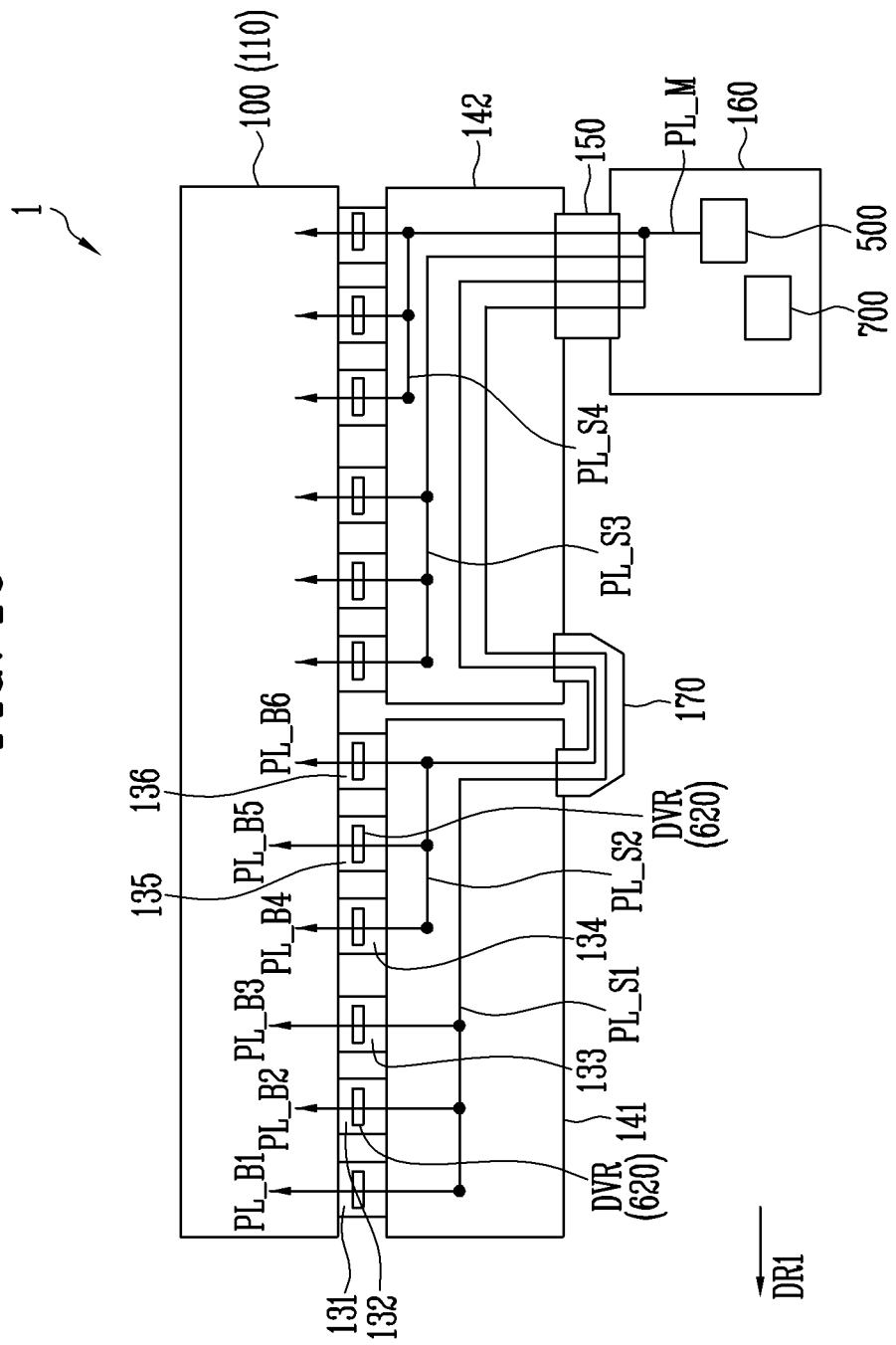

FIG. 10 is a diagram schematically illustrating another embodiment of the display device shown in FIG. 1.

Figure 11:
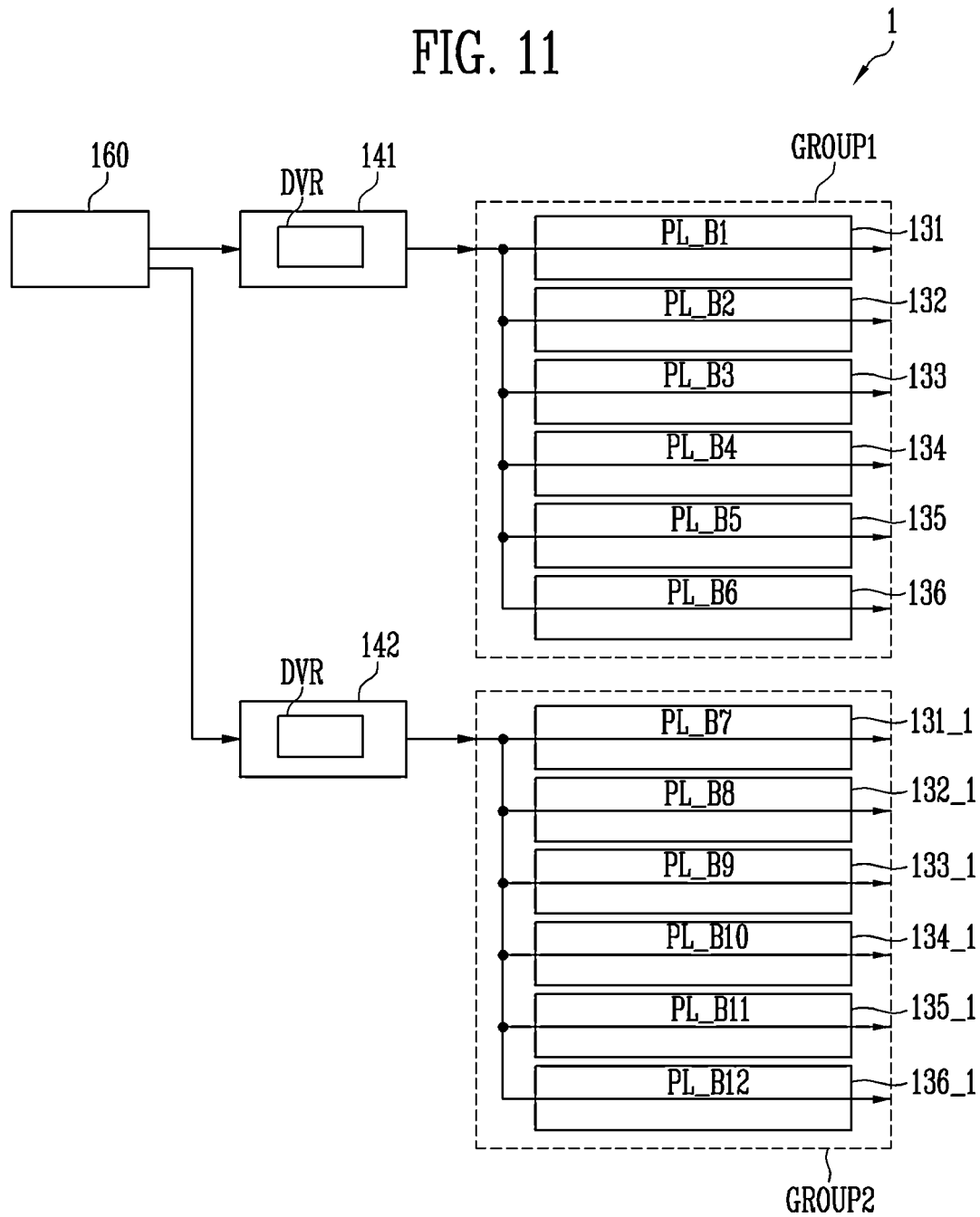
Figure 12:
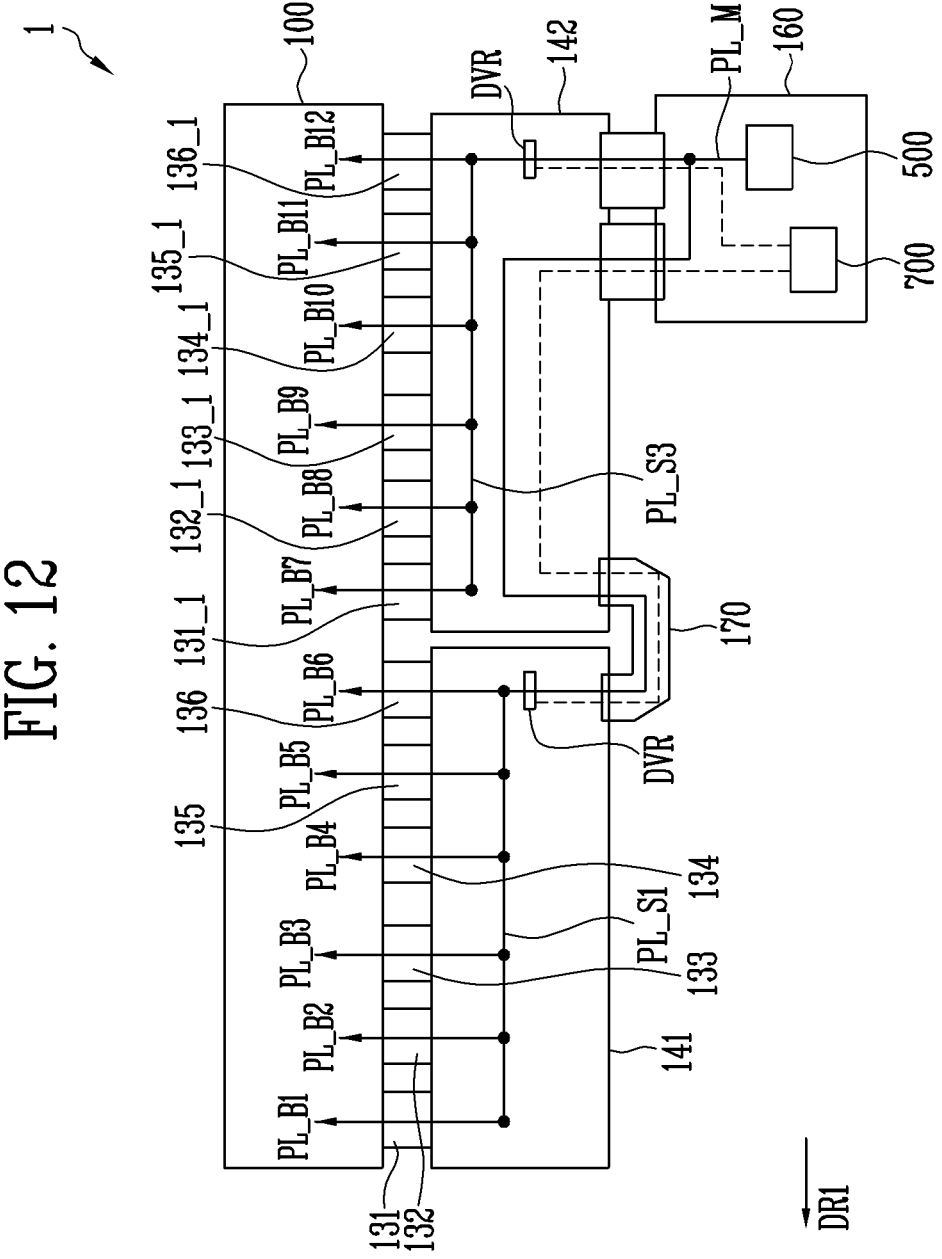

FIGS. 11 and 12 are diagrams schematically illustrating another embodiment of the display device shown in FIG. 1.

Figure 13:
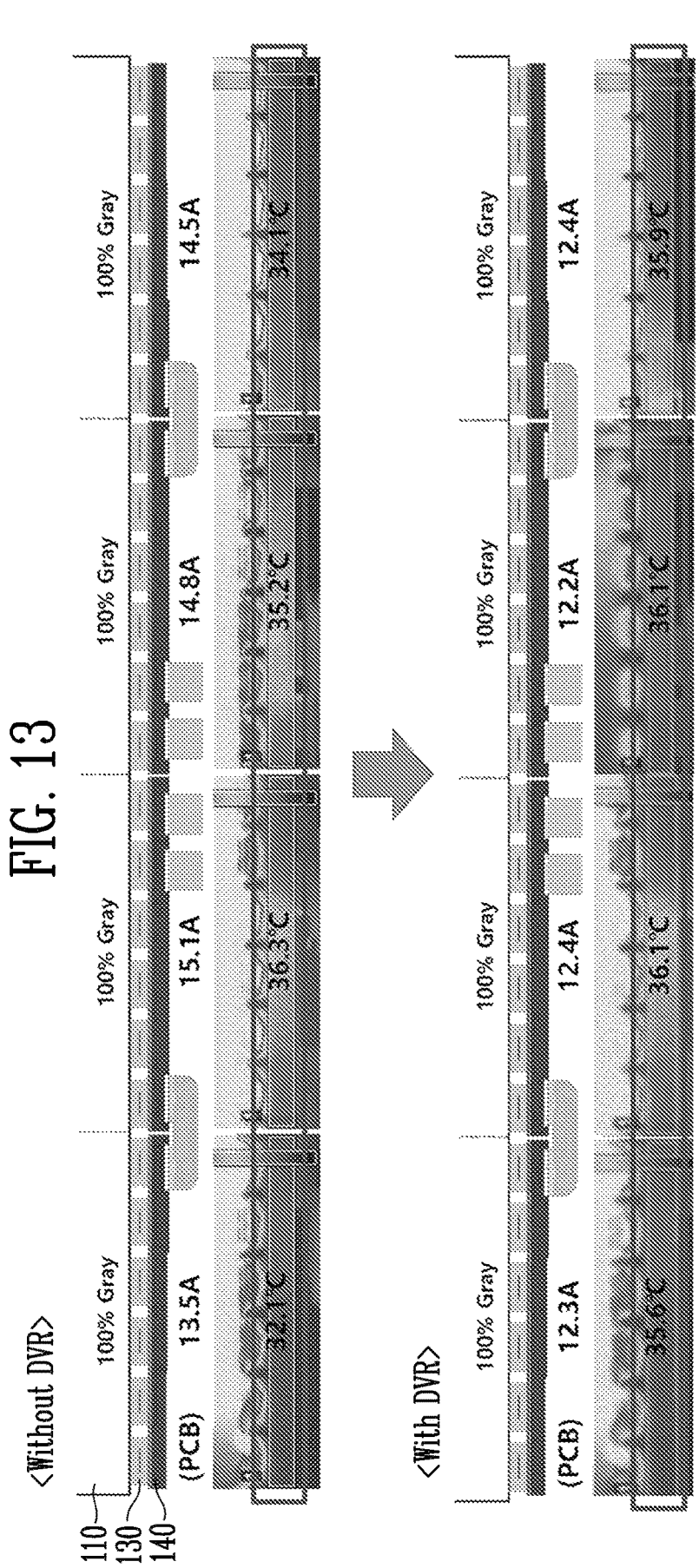

FIG. 13 is a diagram illustrating an effect of a display device in accordance with embodiments of the disclosure.

Figure 14:
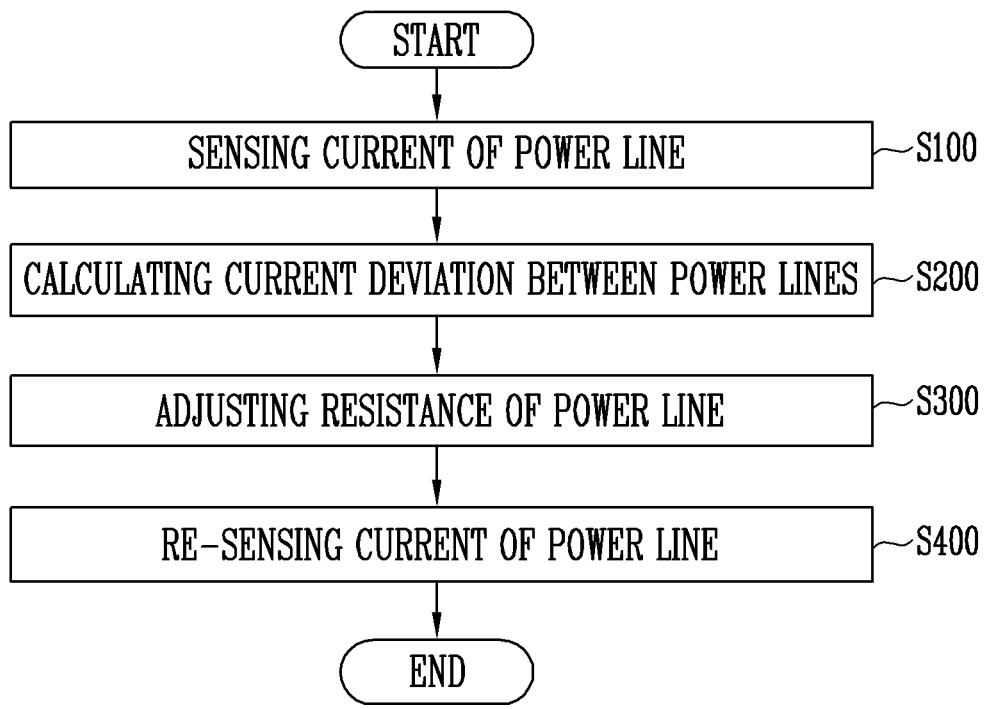

FIG. 14 is a schematic flowchart illustrating a method for driving a display device in accordance with embodiments of the disclosure.

DETAILED DESCRIPTION OF THE EMBODIMENTS

The disclosure may apply various changes and different shape, therefore only illustrate in detail with particular examples. As used herein, the singular forms are intended to include the plural forms as well, unless the context clearly indicates otherwise.

Some embodiments are described in the accompanying drawings in relation to functional blocks, units, and/or modules. Those skilled in the art will understand that these blocks, units, and/or modules are physically implemented by logic circuits, individual components, microprocessors, hard wire circuits, memory elements, line connection, and other electronic circuits. This may be formed by using semiconductor-based manufacturing techniques or other manufacturing techniques. In the case of blocks, units, and/or modules implemented by microprocessors or other similar hardware, the units, and/or modules are programmed and controlled by using software, to perform various functions discussed in the present disclosure, and may be selectively driven by firmware and/or software. In addition, each block, each unit, and/or each module may be implemented by dedicated hardware or by a combination dedicated hardware to perform some functions of the block, the unit, and/or the module and a processor (e.g., one or more programmed microprocessors and associated circuitry) to perform other functions of the block, the unit, and/or the module. In some embodiments, the blocks, the units, and/or the modules may be physically separated into two or more individual blocks, two or more individual units, and/or two or more individual modules without departing from the scope of the disclosure. Also, in some embodiments, the blocks, the units, and/or the modules may be physically separated into more complex blocks, more complex units, and/or more complex modules without departing from the scope of the disclosure.

The term "connection" between two components may include both electrical connection and physical connection, but the disclosure is not necessarily limited thereto. For example, the term "connection" used based on circuit diagrams may mean electrical connection, and the term "connection" used based on sectional and plan views may mean physical connection.

It will be understood that, although the terms "first," "second," and the like may be used herein to describe various elements, these elements should not be limited by these terms. These terms are only used to distinguish one element from another element. Thus, a "first" element discussed below could also be termed a "second" element without departing from the teachings of the disclosure.

Meanwhile, the disclosure is not limited to embodiments disclosed below, and may be implemented in various forms. Each embodiment disclosed below may be independently embodied or be combined with at least another embodiment prior to being embodied.

In the following embodiments and the attached drawings, elements not directly related to the disclosure are omitted from depiction, and dimensional relationships among individual elements in the attached drawings are illustrated only for ease of understanding but not to limit the actual scale. It should note that in giving reference numerals to elements of each drawing, like reference numerals and/or reference characters refer to like elements even though like elements are shown in different drawings.

FIG. 1 is a perspective view schematically illustrating a display device in accordance with embodiments of the disclosure. FIG. 2 is a block diagram schematically illustrating an embodiment of the display device shown in FIG. 1.

Referring to FIGS. 1 and 2, the display device 1 may include a display panel 100, a gate driver (or scan driver) 200, a data driver (or source driver) 300, a timing controller (or processor) 400, a power supply 500, a resistance adjuster (or resistance adjusting circuit), and a power controller (or power control circuit or processor) 700. FIG. 1 illustrates the power controller 700 separately from the timing controller 400. However, in some embodiments, the power controller 700 may be integrated with the timing controller 400. The display device 1 may further include Printed Circuit Boards (PCBs) (or second circuit boards) 140, a first connection part (or first connection member) 150, a main printed circuit board (or printed circuit board or third circuit board) 160, and a second connection part (or second connection member) 170, which are used to connect source driver ICs 310 mounted on flexible films (or first circuit boards) 130 to the timing controller 400.

The display device 1 may be implemented as an organic light emitting display device including an organic light emitting element. However, the display device 1 is not limited thereto. For example, the display device 1 may be implemented as an inorganic light emitting display device including an inorganic light emitting element (e.g., an inorganic light emitting element having a size of nanometer scale to micrometer scale), a liquid crystal display (LCD) device, an electrophoretic display (EPD), or the like. Also, the display device 1 may be implemented as a flexible display device, a rollable display device, a curved display device, a transparent display device, a mirror display device, or the like.

The display panel 100 may display an image. The display panel 100 may include a substrate 110 and a light emitting part 120. The substrate 110 may be a thin-film transistor substrate made of plastic or glass. The substrate 110 may include a pixel circuit of a pixel PX. The light emitting part 120 may be disposed on the substrate 110 or overlap the substrate 110 in a third direction DR3. The light emitting part 120 may include a light emitting element of the pixel PX.

The substrate 110 may include a display area and a non-display area provided at the periphery of the display area. The display area is an area in which pixels PX are provided to display an image. Scan lines SL1 to SLn (where n is an integer of 2 or more) (or gate lines) and data lines DL1 to DLm (where m is an integer of 2 or more) may be disposed on the substrate 110. The data lines DL1 to DLm may be disposed to intersect the scan lines SL1 to SLn, but the disclosure is not limited thereto. The pixels PX may be disposed in areas in which the data lines DL1 to DLm and the scan lines SL1 to SLn intersect each other.

The pixel PX may be electrically connected to one of the scan lines SL1 to SLn and one of the data lines DL1 to DLm. The pixel PX may emit light with a luminance corresponding to a data signal (or data voltage) of the one of the data lines DL1 to DLm in response to a scan signal of the one of the scan lines SL1 to SLn.

The gate driver 200 may supply scan signals to the scan lines SL1 to SLn, based on a scan control signal SCS. The scan control signal SCS may include a start signal, clock signals, and the like, and be provided to the gate driver 200 from the timing controller 400. For example, the gate driver 200 may be implemented as a shift register which generates and outputs a scan signal by sequentially shifting the start signal in a pulse form, using the clock signals.

The gate driver 200 may be formed together with the pixel PX on the display panel 100. For example, the gate driver 200 may be formed in a gate driver in panel (GIP) manner in the non-display area at a side or edges (e.g., both edges) of the display panel 100. However, the disclosure is not limited thereto, and the gate driver 200 may be formed in the display area of the display panel 100. However, the gate driver 200 is not limited thereto. For example, the gate driver 200 may be implemented as an integrated circuit (IC) to be mounted on a circuit film (e.g., the flexible film 130).

The data driver 300 may generate a data signal (or data voltage), based on image data DATA and a data control signal DCS, and provide the data signal to the display panel 100 (or the pixel PX) through the data lines DL1 to DLm. The image data DATA and the data control signal DCS may be provided from the timing controller 400. The data control signal DCS may be a signal for controlling an operation of the data driver 300, and may include a horizontal start signal, a data clock signal, and the like. For example, the data driver 300 may include a shift register which generates a sampling signal by shifting the horizontal start signal in synchronization with the data clock signal, a latch which latches the image data DATA in response to the sampling signal, a digital-analog converter (or decoder) which converts the latched image data (e.g., data in a digital form) into a data signal in an analog form, and a buffer (or amplifier) which outputs the data signal to the data lines DL1 to DLm.

As shown in FIG. 1, the data driver 300 may include Source Driver Integrated Circuits (SDICs or source driver ICs) 310. Each of the source driver ICs 310 may be mounted on the flexible films 130. The flexible films 130 may be electrically connected to an end portion of the display panel 100 in a second direction DR2, and be arranged in a first direction DR1. The flexible films 130 may be respectively attached onto pads provided on the substrate 110 in a Tape Automated Bonding (TAB) manner, using an Anisotropic Conductive Film (ACF). The pads may be electrically connected to the data lines DL1 to DLm, and the source driver ICs 310 may be electrically connected to the data lines DL1 to DLm through the pads.

Each of the flexible films 130 may be provided in a Chip-On-Film (COF) manner or a Chip-On-Plastic (COP) manner. A chip-on-film may include a base film such as polyimide and conductive signal lines provided on the base film. Each of the flexible films 130 may be curved or bent.

The source driver ICs 310 may be electrically connected to each other by the printed circuit boards 140. The flexible films 130 may electrically connect the printed circuit boards 140 to the substrate 110 of the display panel 100. The printed circuit board 140 may be a Flexible Printed Circuit Board (FPCB).

The main printed circuit board 160 may have the timing controller 400, the power supply 500, and the power controller 700, which are mounted thereon. The main printed circuit board 160 may be electrically connected to the printed circuit board 140 through the first connection part 150. The printed circuit board 140 which is not directly connected to the main printed circuit board 160 through the first connection part 150 may be electrically connected to an adjacent printed circuit board 140 through the second connection part 170.

The first connection part 150 and the second connection part 170 may include signal lines including a bus as an input/output terminal to which an intra-interface is applied between the timing controller 400 and the source driver ICs 310. The intra-interface may be an interface capable of processing input data at a high speed. However, the disclosure is not limited thereto, and the first connection part 150 and the second connection part 170 may be implemented with signal lines including an arbitrary interface and an arbitrary input/output terminal, which can transmit data. For example, each of the first connection part 150 and the second connection part 170 may be a Flexible Flat Cable (FFC).

The timing controller 400 may receive input image data IDATA and a control signal CS from a host processor (or main processor). For example, the host processor may include an application processor (AP), a mobile AP, a central processing unit (CPU), and a graphics processing unit (GPU). In some embodiments, the host processor may include a System-on-Chip (SoC) having a scaler built therein. The input image data IDATA may include at least one image frame. The control signal CS may include a synchronization signal, a clock signal, and the like.

The timing controller 400 may generate the scan control signal SCS for controlling an operation timing of the gate driver 200 and the data control signal DCS for controlling an operation timing of the data driver 300, based on the control signal CS. The timing controller 400 may provide the scan control signal SCS to the gate driver 200 and provide the data control signal DCS to the data driver 300.

Also, the timing controller 400 may generate image data DATA by converting the input image data IDATA. For example, the timing controller 400 may convert the input image data IDATA into the image data DATA having a format corresponding to an arrangement of the pixels PX in the display panel 100 (e.g., a format conversion operation). In another example, the timing controller 400 may generate the image data DATA by compensating for the input image data IDATA, using a degradation compensation technique or the like for compensating for degradation of the pixel PX, or the like (e.g., a degradation compensation operation). The timing controller 400 may generate the image data DATA by compensating for the input image data IDATA, using various compensation techniques.

The power supply 500 may supply power voltages to the display panel 100 through power lines PL. The power line PL (or route) may refer to a route through which power voltages are applied between the power supply 500 and the display panel 100 or through which a driving current according to a power voltage flows, and power lines PL or routes may exist between the power supply 500 and the display panel 100. The power voltages may be driving voltages necessary for an operation of the pixel PX. For example, the power voltages may include a first power voltage VDD (see FIG. 3) and a second power voltage VSS (see FIG. 3). The first power voltage VDD may have a voltage level higher than a voltage level of the second power voltage. For example, the first power voltage VDD may be a positive voltage, and the second power voltage VSS may be a negative voltage. However, the disclosure is not limited thereto. The power supply 500 may be implemented as a Power Management Integrated Circuit (PMIC) or the like. In accordance with an embodiment, the power supply 500 may be disposed at substantially the same distance from the two first connection parts 150.

The resistance adjuster 600 may be disposed between the power supply 500 and the display panel 100. The resistance adjuster 600 may be disposed or mounted on at least one of circuit boards between the power supply 500 and the display panel 100. For example, the resistance adjuster 600 may be disposed on the flexible film 130 (see FIG. 9) or be disposed on the printed circuit board 140 (see FIG. 12). However, the disposition position of the resistance adjuster 600 is not limited thereto. For example, the resistance adjuster 600 may be disposed on the main printed circuit board 160.

The resistance adjuster 600 may adjust or vary a resistance of at least one of the power lines PL such that currents flowing through the power lines PL or loads of the power lines PL are substantially uniform.

In embodiments, the resistance adjuster 600 may measure a resistance of at least one power line PL (or route) or a current flowing through at least one power line PL, and may adjust or vary a resistance of at least one power line PL (e.g., a resistance of a route through which a driving current flows between the power supply 500 and the display panel 100). The resistance adjuster 600 may include a block DVR (or resistance adjusting block) electrically connected to at least one power line PL. In some embodiments, the block DVR may be implemented as an integrated circuit including a shut resistor and a digital variable resistor.

The power controller 700 may identify a current deviation for each power line PL, based on a resistance measurement value or a current measurement value, which is acquired through the resistance adjuster 600, and may calculate a resistance value (or resistance parameter) for each power line PL, which is used to minimize the current deviation. For example, the power controller 700 may determine whether the current deviation is out of a reference range, and may calculate a resistance value for each power line PL such that the current deviation is within the reference range. The resistance adjuster 600 may adjust or vary a resistance of the power line PL, based on the resistance value (resistance parameter or offset).

In embodiments, the power controller 700 may control the resistance adjuster 600 to perform current sensing or resistance adjustment in case that the display device 1 (or the display panel 100) is initially driven, in case that a specific pattern is detected, or periodically.

In an embodiment, the power controller 700 may control the resistance adjuster 600 to identify a current deviation in initial driving of the display device 1 (e.g., just after power-on of the display device 1) and to adjust a resistance of the power line PL.

In another embodiment, the power controller 700 may control the resistance adjuster 600 to detect a specific pattern, based on the input image data IDATA (or image data DATA), and to perform an operation of identifying a current deviation and an operation of adjusting a resistance of the power line PL in case that the specific pattern is detected. The specific pattern may be an image pattern in which the current deviation becomes larger than the reference range. For example, the specific pattern may be a pattern in which a high-luminance image is displayed in only a specific area (or a partial area of the display panel 100). For example, the power controller 700 may determine whether a specific pattern occurs by comparing input image data IDATA of a current frame (e.g., current frame data) with input image data IDATA of a previous frame (e.g., previous frame data).

For example, in case that a grayscale of the input image data IDATA is relatively high, a driving current amount required for a display image may be relatively high. For example, in case that a white box pattern in which about 20% of a left area is a white image corresponding to a maximum grayscale and the other area is a black image corresponding to a minimum grayscale is displayed on the display panel 100, a driving current may be concentrated on a power line PL corresponding to the about 20% of the left area, and heat generation and burnt defects may occur in the power line PL. Thus, the power controller 700 can detect a specific pattern (e.g., a specific pattern such as the white box pattern), based on the input image data IDATA.

In case that the specific pattern is detected, the power controller 700 may control the resistance adjuster 600 to adjust a resistance of the power line PL, based on the specific pattern. For example, the power controller 700 may set a resistance value by using an offset pre-set or pre-stored corresponding to the specific pattern, or may set a resistance value by predicting a current deviation, based on the specific pattern.

In still another embodiment, the power controller 700 may control the resistance adjuster 600 to periodically perform an operation of identifying a current deviation and an operation of adjusting a resistance of the power line PL during driving of the display device 1.

As illustrated in FIGS. 1 and 2, each of the data driver 300 and the timing controller 400 may be implemented as a separate integrated circuit. However, the disclosure is not limited thereto. For example, the data driver 300 and the timing controller 400 may be implemented into an integrated circuit. In some embodiments, at least two of the gate driver 200, the data driver 300, and the timing controller 400 may be implemented into an integrated circuit.

FIG. 3 is a schematic diagram of an equivalent circuit illustrating an embodiment of the pixel included in the display device shown in FIG. 2. For convenience of description, a pixel PX corresponding to an ith row (or i-th row) and a jth column (or j-th column) will be mainly described.

Referring to FIG. 3, the pixel PX may include a light emitting element LD and a pixel circuit PXC electrically connected to the light emitting element LD to drive the light emitting element LD.

A first electrode (e.g., an anode electrode) of the light emitting element LD may be electrically connected to a first power line PL1 via the pixel circuit PXC, and a second electrode (e.g., a cathode electrode) of the light emitting element LD may be electrically connected to a second power line PL2. A first power voltage VDD may be applied to the first power line PL1, and a second power voltage VSS may be applied to the second power line PL2. The light emitting element LD may emit light with a luminance corresponding to a driving current amount controlled by the pixel circuit PXC.

The light emitting element LD may include an organic light emitting diode. Also, the light emitting element LD may include an inorganic light emitting diode such as a micro light emitting diode or a quantum dot light emitting diode. In some embodiments, the light emitting element LD may be an element configured with a combination of an organic material and an inorganic material. FIG. 3 illustrates that the pixel PX includes a single light emitting element LD. However, in another embodiment, the pixel PX may include light emitting elements, and the light emitting elements may be electrically connected in series, parallel, or series or parallel to each other.

In some embodiments, the pixel PX may further include a capacitor C_LD electrically connected in parallel to the light emitting element LD. The capacitor C_LD may be formed by overlapping of the second power line PL2 and a second node N2. In some embodiments, the capacitor C_LD may be a parasitic capacitor.

The pixel circuit PXC may include a first transistor T1, a second transistor T2, a third transistor T3, and a storage capacitor Cst.

The first transistor T1 may be a driving transistor for controlling a driving current applied to the light emitting element LD, and may be electrically connected between the first power line PL and the light emitting element LD. Specifically, a first terminal of the first transistor T1 may be electrically connected (or coupled) to the first power line PL1, a second terminal of the first transistor T1 may be electrically connected to the second node N2, and a gate electrode of the first transistor T1 may be electrically connected to a first node N1. The first transistor T1 may control an amount of driving current applied from the first power voltage VDD to the light emitting element LD through the second node N2 according to a voltage applied to the first node N1. In an embodiment, the first terminal of the first transistor T1 may be a drain electrode, and the second terminal of the first transistor T1 may be a source electrode. However, the disclosure is not limited thereto. In some embodiments, the first terminal may be a source electrode and the second terminal may be a drain electrode.

The second transistor T2 may be a switching transistor which selects a pixel PX in response to a scan signal SC and activates the pixel PX, and may be electrically connected between a data line DLj and the first node N1. A first terminal of the second transistor T2 may be electrically connected to the data line DLj, a second terminal of the second transistor T2 may be electrically connected to the first node N1, and a gate electrode of the second transistor T2 may be electrically connected to a scan line SLi. The first terminal and the second terminal of the second transistor T2 are different terminals. For example, in case that the first terminal is a drain electrode, the second terminal may be a source electrode.

The second transistor T2 may be turned on in case that the scan signal SC having a gate-on voltage (e.g., a high-level voltage) is supplied from the scan line SLi, to electrically connect the data line DLj and the first node N1 to each other. The first node N1 may be a point at which the second terminal of the second transistor T2 and the gate electrode of the first transistor T1 are electrically connected to each other, and the second transistor T2 may transfer a data voltage to the gate electrode of the first transistor T1.

A second terminal of the third transistor T3 may be electrically connected to the second terminal of the first transistor T1, a first terminal of the third transistor T3 may be electrically connected to a sensing line RLj (or readout line), and a gate electrode of the third transistor T3 may be electrically connected to a sensing scan line SSLi. An initialization power source may be applied to the sensing line RLj. The third transistor T3 may be an initialization transistor capable of initializing the second node N2, and may be turned on in case that a sensing scan signal SS is supplied from the sensing scan line SSLi, to transfer a voltage of the initialization power source to the second node N2. Accordingly, the second node N2 can be initialized. In some embodiments, the sensing scan line SSLi may be the scan line SLi, be electrically connected to the scan line SLi, or receive the scan signal SC.

In some embodiments, the third transistor T3 may electrically connect the first transistor T1 to the sensing line RLj, so that a sensing signal is acquired through the sensing line RLj, characteristics of each pixel PX, including a threshold voltage of the first transistor T1, and the like, can be detected by using the sensing signal. Information on the characteristics of each pixel PX may be used to convert image data such that a characteristic deviation between the pixels PX can be compensated for.

The storage capacitor Cst may be formed or electrically connected between the first node N1 and the second node N2. A first storage electrode of the storage capacitor Cst may be electrically connected to the first node N1, and a second storage electrode of the storage capacitor Cst may be electrically connected to the second node N2. The storage capacitor Cst may be charged with a data voltage corresponding to the data signal supplied to the first node N1 during a frame period. Accordingly, the storage capacitor Cst can store a voltage corresponding to a difference between a voltage of the gate electrode of the first transistor T1 and a voltage of the second node N2.

For convenience of description, FIG. 3 illustrates the pixel PX in a relatively simple form, however, the structure of the pixel circuit PXC may be variously modified and embodied. In an example, the pixel circuit PXC may additionally further include various types of transistors such as a compensation transistor for compensating for the threshold voltage of the first transistor T1, an initialization transistor for initializing the first node N1, and/or an emission control transistor for controlling a light emission time of the light emitting element LD, or other circuit elements such as a boosting capacitor for boosting a voltage of the first node N1.

Also, FIG. 3 illustrates that the transistors, e.g., the first, second, and third transistors T1, T2, and T3, which are included in the pixel circuit PXC, are all N-type transistors. However, the disclosure is not limited thereto. For example, at least one of the first, second, and third transistors T1, T2, and T3 included in the pixel circuit PXC may be replaced with a P-type transistor.

FIG. 4 is a schematic block diagram illustrating an embodiment of the resistance adjuster included in the display device shown in FIG. 2. FIG. 5 is a diagram schematically illustrating an embodiment of a sensing block included in the resistance adjuster shown in FIG. 4. FIG. 6 is a diagram schematically illustrating an embodiment of a variable resistance block included in the resistance adjuster shown in FIG. 4.

First, referring to FIGS. 1, 2, and 4, the resistance adjuster 600 (or each block DVR) may include a sensing block 610 and a variable resistance block 620.

The sensing block 610 may measure a resistance of a power line PL (or route) or a current flowing through the power line PL. The sensing block 610 may provide the power controller 700 with the measured resistance or the measured current, e.g., a sensing value SV (or sensing signal). For example, the sensing value SV may be provided from the sensing block 610 to the power controller 700 through an intra-interface.

In an embodiment, the sensing block 610 may be implemented as a current measuring circuit including a shunt resistor.

An example will be described with reference to FIG. 5. The sensing block 610 may include at least one of a first sensing circuit 611 and a second sensing circuit 612 and an analog-digital converter ADC.

The first sensing circuit 611 may be disposed at a front end of a load, and the second sensing circuit 612 may be disposed at a rear end of the load. For example, the load may correspond to the pixels PX in the display panel 100, the first sensing circuit 611 may be electrically connected between a power line to which the first power voltage VDD is applied and the load, and the second sensing circuit 612 may be electrically connected between the load and a ground (or a power line to which the second power voltage VSS is applied).

The first sensing circuit 611 may include a first sensing resistor R_S1, resistors R1 to R4, and a first amplifier AMP1.

The first sensing resistor R_S1 may be electrically connected between the power line to which the first power voltage VDD is applied and the load. A first resistor R1 may be electrically connected between a reference power source VREF and a first terminal (+) of the first amplifier AMP1, and a second resistor R2 may be electrically connected between an end of the first sensing resistor R_S1 and the first terminal (+) of the first amplifier AMP1. A third resistor R3 may be electrically connected between the other end of the first sensing resistor R_S1 and a second terminal (−) of the first amplifier AMP1, and a fourth resistor R4 may be electrically connected between the second terminal (−) of the first amplifier AMP1 and an output terminal OUT1 of the first amplifier AMP1. In some embodiments, the reference power source VREF may be a ground.

The first sensing circuit 611 may amplify and output a voltage applied to the ends (or both the ends) of the first sensing resistor R_S1 through the first amplifier AMP1. Since a resistance value of the first sensing resistor R_S1 is predetermined, the voltage may correspond to a current amount, or the current amount may be calculated by the voltage. The analog-digital converter ADC may output a sensing value SV (current value or sensing signal) corresponding to an output of the first sensing circuit 611.

Similar to the first sensing circuit 611, the second sensing circuit 612 may include a second sensing resistor R_S2, resistors R1 to R4, and a second amplifier AMP2. The second sensing circuit 612 may be distinguishable from the first sensing circuit 611 at least in a disposition position thereof, and therefore, repetitive descriptions will be omitted.

The second sensing circuit 612 may amplify a voltage applied to ends (or both ends) of the second sensing resistor R_S2 through the second amplifier AMP2 and output the voltage through an output terminal OUT2. The analog-digital converter ADC may output a sensing value SV corresponding to an output of the second sensing circuit 612.

In case that the sensing block 610 includes the first sensing circuit 611 and the second sensing circuit 612, the analog-digital converter ADC may output a sensing value SV corresponding to a differential value between the output of the first sensing circuit 611 and the output of the second sensing circuit 612.

Referring back to FIGS. 2 and 4, the variable resistance block 620 may control or vary a resistance of the power line PL, based on a resistance control value RV (control signal, resistance parameter or offset). The resistance control value RV may be provided from the power controller 700. For example, the resistance control value RV may be provided from the power controller 700 to the variable resistance block 620 through the intra-interface.

In an embodiment, the variable resistance block 620 may be implemented as a digital variable resistance.

An example will be described with reference to FIG. 6. The variable resistance block 620 may include a control circuit 621 and a variable resistor 622.

The variable resistor 622 may be electrically connected between the power line to which the first power voltage VDD is applied and a load, and a resistance value RW of the variable resistor 622 may be adjusted within a range between a highest resistance value RH and a lowest resistance value RL. For example, the variable resistor 622 may be implemented with resistors electrically connected in series or parallel and transistors electrically connected to the resistors. According to on/off of the transistors, a connection relationship of the resistors in the variable resistor 622 may be changed, and the resistance value RW of the variable resistor 622 may vary.

The control circuit 621 may include a memory counter register and a decoder. The memory counter register may record a resistance control value RV and output the recorded resistance control value RV. The decoder may output signals for adjusting the resistance value RW of the variable resistor 622 (e.g., signals for turning on/off the transistors in the variable resistor 622), corresponding to the resistance control value RV. For example, the resistance value RW of the variable resistor 622 may be adjusted according to an output of the decoder.

As described above, the resistance adjuster 600 (or each block DVR) may measure a current of the power line PL by using the shunt resistor, and may adjust a resistance of the power line PL by using the digital variable resistor. However, this is merely illustrative, and the configuration of the resistance adjuster 600 may be variously modified within a range in which the current flowing through the power line PL can be measured or in which the resistance of the power line PL can be adjusted.

FIG. 7 is a schematic diagram illustrating a comparative embodiment of the display device shown in FIG. 1.

Referring to FIGS. 1, 2, and 7, a display device 1_C shown in FIG. 7 may not include the resistance adjuster 600 (see FIG. 2) and the power controller 700 (see FIG. 2).

A source driver IC 310 may be mounted on each of flexible films 130. Sides of the flexible films 130 may be electrically connected to a side of the display panel 100 (or substrate 110). The other sides of the flexible films 130 may be electrically connected to printed circuit boards 140. Some (e.g., second and third printed circuit boards 142 and 143) of the printed circuit boards 140 may be directly electrically connected to a main printed circuit board 160 through first connection parts 150, and the others (e.g., first and fourth printed circuit boards 141 and 144) of the printed circuit boards 140 may be respectively electrically connected e some (e.g., the second and third printed circuit boards 142 and 144) of the printed circuit boards 140 through second connection parts 170. The power supply 500 may be mounted on the main printed circuit board 160.

A main power line PL_M electrically connected to the power supply 500 in the main printed circuit board 160 may branch off into a first sub-power line PL_S1 and a second sub-power line PL_S2. The first sub-power line PL_S1 (or first route) may extend to a left connection part 150, the second printed circuit board 142, a left second connection part 170, and the first printed circuit board 141. The first sub-power line PL_S1 may branch off (or split) into lines PL_B1 to PL_B6 (or branch power lines) toward flexible films 130 electrically connected to the first and second printed circuit boards 141 and 142. The main power line PL_M may be the first power line PL1 shown in FIG. 3, but the disclosure is not limited thereto. For example, the main power line PL_M may be the second power line PL2 shown in FIG. 3. The main power line PL_M, the first and second sub-power lines PL_S1 and PL_S2, and the lines PL_B1 to PL_B6 may be distinguished from each other according to a disposition position (or route) thereof. The power line PL_M, the first and second sub-power lines PL_S1 and PL_S2, and the lines PL_B1 to PL_B6 may be included in the power line PL. In some embodiments, a first line PL_B1 may be electrically connected to a source driver IC 311 most spaced apart from the power supply 500 in the first direction DR1, or be electrically connected to the display panel 100 via a flexible film 130 on which the source driver IC 311 is mounted. Each of the other lines PL_B2 to PL_B6 may be electrically connected to a corresponding source driver IC 310, or be electrically connected to the display panel 100 via a corresponding flexible film 130. The lines PL_B1 to PL_B6 may be electrically connected to each other in the display panel 100. The lines PL_B1 to PL_B6 (or a power line of the display panel 100, to which the lines PL_B1 to PL_B6 are electrically connected) may entirely have a mesh structure in the display panel 100.

The second sub-power line PL_S2 (or second route) may extend to a right first connection part 150, the third printed circuit board 143, a right second connection part 170, and the fourth printed circuit board 144. The second sub-power line PL_S2 may branch off into lines toward flexible films 130 electrically connected to the third and fourth printed circuit boards 143 and 144. In some embodiments, a rightmost line may be electrically connected to a source driver IC 312 most spaced apart from the power supply 500 in the opposite direction of the first direction DR1, or be electrically connected to the display panel 100 via a flexible film 130 on which the source driver IC 312 is mounted. Similarly, each of the other lines may be electrically connected to a corresponding source driver IC 310, or be electrically connected to the display panel 100 via a corresponding flexible film 130.

A resistance deviation between routes from the power supply 500 to the display panel 100 (or, for example, routes corresponding to the lines PL_B1 to PL_B6) and a current deviation according thereto may occur according to a connection resistance between the display panel 100, the flexible film 130, the printed circuit boards 140, the first connection part 150, the main printed circuit board 160, and the second connection part 170, lengths of routes, and the like. An example will be described with reference to FIG. 13. In case that the display panel 100 displays a full-white image (e.g., an image corresponding to a maximum grayscale of 100%), a current of about 13.5 A may flow through routes corresponding to the first printed circuit board 141, a current of about 15.1 A may flow through routes corresponding to the second printed circuit board 142, a current of about 14.8 A may flow through routes corresponding to the third printed circuit board 143, and a current of about 14.5 A may flow through routes corresponding to the fourth printed circuit board 144. Accordingly, a temperature deviation may occur between the printed circuit boards 140 (flexible films 130 corresponding thereto, and areas of the display panel 100), and burnt defects may occur in some cases. The pixels PX may be degraded differently from each other for each area of the display panel 100 according to the temperature (e.g., the pixel PX is further degraded as the temperature becomes higher), which results in deterioration of display quality.

Thus, the display device 1 in accordance with the embodiments of the disclosure can minimize a current deviation and a temperature deviation between routes (or current flow routes) from the power supply 500 to the display panel 100 by using the resistance adjuster 600, and accordingly, occurrence of burnt defects, deterioration of display quality, and the like can be reduced or prevented.

FIGS. 8 and 9 are diagrams schematically illustrating an embodiment of the display device shown in FIG. 1. FIG. 8 illustrates the display device 1, based on a current flow route, and FIG. 9 illustrates only a portion of the display device 1 shown in FIG. 1, corresponding to FIG. 8. FIG. 10 is a diagram schematically illustrating another embodiment of the display device shown in FIG. 1. FIG. 10 may correspond to FIG. 9.

First, referring to FIGS. 1, 2, 7, 8, and 9, the display device 1 shown in FIGS. 8 and 9 may be distinguishable from the display device 1 shown in FIG. 1 (and the display device 1_C shown in FIG. 7) at least in a disposition position of a block DVR (or a resistance adjusting block or resistance adjuster 600). Therefore, repetitive descriptions will be omitted.

In embodiments, the display device 1 may group power lines (e.g., lines PL_B1 to PL_B6) or routes, which respectively correspond to flexible films 131 to 136, may measure a current for each group, and may adjust or vary a resistance of each of the power lines or the routes according to the current measured for each group.

In case that the power lines are grouped and a current is measured, the number of lines for current measurement can be decreased, and an increase in area of the printed circuit board 140, the first connection part 150, and the main printed circuit board 160 and an increase in number of pins (e.g., pins of the first connection part 150) can be reduced (or a pin shortage problem can be resolved), as compared with a configuration in which a current is measured for each power line.

As shown in FIGS. 8 and 9, three of the lines PL_B1 to PL_B6 may be grouped into a group. For example, first, second, and third lines PL_B1, PL_B2, and PL_B3 corresponding to first, second, and third flexible films 131, 132, and 133 may be grouped into a first group GROUP1. Similarly, fourth, fifth, and sixth lines PL_B4, PL_B5, and PL_B6 corresponding to fourth, fifth, and sixth flexible films 134, 135, and 136 may be grouped into a second group GROUP2. As shown in FIG. 9, lines electrically connected to a third sub-power line PL_S3 may constitute a group, and lines electrically connected to a fourth sub-power line PL_S4 may constitute a group.

In an embodiment, a block DVR (or resistance adjusting block) may be disposed at a line PL_B2 or PL_B5 in a group. For example, a block DVR may be disposed on the second flexible film 132 corresponding to the second line PL_B2 of the first group GROUP1, and a block DVR may be disposed on the fifth flexible film 135 corresponding to the fifth line PL_B5 of the second group GROUP2. However, this is merely illustrative, and the block DVR may be disposed on the first flexible film 131 and the fourth flexible film 134, or be disposed on the third flexible film 133 and the sixth flexible film 136. The block DVR may be implemented as an integrated circuit independent of the source driver IC 310 (see FIG. 7), but the disclosure is not limited thereto. In some embodiments, the block DVR may be included in the source driver IC. As shown in FIG. 9, the block DVR may be electrically connected to the power controller 700 in the main printed circuit board 160 through the first and second printed circuit boards 141 and 142 and the first connection part 150 (and the second connection part 170).

Although only a block DVR is disposed for each group, a resistance may be adjusted for each of sub-power lines PL_S1 to PL_S4, and a current deviation for each group may be reduced. For example, in case that a resistance of the second line PL_B2 is varied by the block DVR of the second flexible film 132, the entire resistance of a route including a first sub-power line PL_S1 electrically connected to the second line PL_B2 may be varied. For example, since a resistance of the first sub-power line PL_S1, viewed from the power supply 500, is varied, a current may be uniformly supplied to the sub-power lines PL_S1 to PL_S4, based on the varied resistance.

In another embodiment, as shown in FIG. 10, a block DVR (or resistance adjusting block) may be disposed at each of the lines PL_B1 to PL_B6. For example, the block DVR may be disposed on each of the flexible films 131 to 136 corresponding to the lines PL_B1 to PL_B6.

For example, although a current is measured for each group as shown in FIG. 9 (e.g., although the sensing block 610 shown in FIG. 4 is disposed corresponding to the block DVR shown in FIG. 9), a component for adjusting a resistance (e.g., the variable resistance block 620 shown in FIG. 4) may be disposed corresponding to the block DVR shown in FIG. 10. The number of components for measuring a current (e.g., the sensing block 610 shown in FIG. 4) and the number of components for adjusting a resistance (e.g., the variable resistance block 620) may be different from each other. In some embodiments, blocks DVR included in a group may be controlled by a resistance control value RV (see FIG. 4). For example, blocks DVR included in a group may respectively adjust resistances of lines included in the group, based on a resistance control value RV. However, the disclosure is not limited thereto.

In another example, each block DVR shown in FIG. 10 may perform both a current measuring operation and a resistance varying operation. As described above, in case that the area of the printed circuit board 140, the first connection part 150, and the main printed circuit board 160 and the number of pins are sufficient, the block DVR may be disposed on each of the flexible films 131 to 136, and each block DVR may perform the current measuring operation and the resistance varying operation.

Although FIGS. 8 and 9 illustrate that three of the lines PL_B1 to PL_B6 form (or constitute) a group, the disclosure is not limited thereto. For example, two or four or more of the lines PL_B1 to PL_B6 may be grouped into a group, and the number of lines included in a group may be variously changed according to a total number of lines (or routes).

FIGS. 11 and 12 are diagrams schematically illustrating another embodiment of the display device shown in FIG. 1. FIG. 11 illustrates the display device 1, based on a current flow route, and FIG. 12 illustrates only a portion of the display device 1 shown in FIG. 1, corresponding to FIG. 9.

Referring to FIGS. 1, 2, and 7 to 12, the display device 1 shown in FIGS. 11 and 12 may be distinguishable from the display device 1 shown in FIGS. 8 and 9 at least in a disposition position of a block DVR (or a resistance adjusting block or resistance adjuster 600). Therefore, repetitive descriptions will be omitted.

In embodiments, the display device 1 may group power lines (e.g., lines PL_B1 to PL_B6) or routes for each printed circuit board, may measure a current for each group, and may adjust or vary resistances of the power lines or the routes according to the current measured for each group.

As shown in FIGS. 11 and 12, lines PL_B1 to PL_B6 branching off from a first sub-power line PL_S1 in the first printed circuit board 141 may be grouped into a first group GROUP1. Similarly, lines PL_B7 to PL_B12 branching off from a third sub-power line PL_S3 in the second printed circuit board 142 may be grouped into a second group GROUP2. The lines PL_B7 to PL_B12 may correspond to flexible films 131_1 to 136_1, respectively.

In an embodiment, a block DVR (or resistance adjusting block) may be disposed on each of the first and second printed circuit boards 141 and 142. For example, a block DVR for the first group GROUP1 may be disposed on the first printed circuit board 141. The block DVR may measure a current flowing through the first sub-power line PL_S1, and adjust or vary a resistance of the first sub-power line PL_S1. For example, a block DVR for the second group GROUP2 may be disposed on the second printed circuit board 142. The block DVR may measure a current flowing through the third sub-power line PL_S3, and adjust or vary a resistance of the third sub-power line PL_S3.

FIG. 13 is a schematic diagram illustrating an effect of a display device in accordance with embodiments of the disclosure. FIG. 13 illustrates a portion of the display device, which corresponds to FIG. 7, and a current and a temperature, which are measured in case that the display device displays a full-white image (e.g., an image corresponding to a grayscale of 100%).

Referring to FIGS. 1, 2, and 7 to 13, in case that the display device does not include the block DVR (or resistance adjuster 600) or in case that the block DVR is not operated, currents measured with respect to printed circuit boards 140 (e.g., currents flowing through power lines) may be about 13.5 A, about 15.1 A, about 14.8 A, and about 14.5 A, and temperatures measured with respect to the printed circuit boards 140 may be about 32.1° C., about 36.3° C., about 35.2° C., and about 34.1° C. For example, between the printed circuit boards 140, a maximum current difference may be about 1.6 A, and a maximum temperature difference may be about 4.2° C.

In case that the display device includes the block DVR (or resistance adjuster 600) or in case that the block DVR is operated, currents measured with respect to the printed circuit boards 140 may be about 12.3 A, about 12.4 A, about 12.2 A, and about 12.4 A, and temperatures measured with respect to the printed circuit boards 140 may be about 35.6° C., about 36.1° C., about 36.1° C., and about 35.9° C. For example, between the printed circuit boards 140, a maximum current difference may be about 0.2 A, and a maximum temperature difference may be about 0.5° C.

For example, by the operation of the block DVR, a current deviation between the printed circuit boards 140 (or between the power lines) can be decreased, and a temperature deviation between the printed circuit boards 140 can also be decreased. Further, burnt defects, deterioration of display quality, and the like, which are caused by the current deviation and the temperature deviation, can be reduced or prevented.

FIG. 14 is a schematic flowchart illustrating a method for driving a display device in accordance with embodiments of the disclosure.

Referring to FIGS. 1 to 14, the method shown in FIG. 14 may be performed by the display device shown in FIG. 1.

The method shown in FIG. 14 may sense or measure a current of a power line PL (S100).

In an embodiment, as described with reference to FIG. 10, the method shown in FIG. 14 may sense a current for each of the lines PL_B1 to PL_B6 corresponding to the flexible films 130.

In another embodiment, the method shown in FIG. 14 may group the lines PL_B1 to PL_B6, and sense a current for each group.

For example, as described with reference to FIGS. 8 to 9, the method shown in FIG. 14 may group three of the lines PL_B1 to PL_B6 into a group, and sense a current with respect to only a line in the group.

In another example, as described with reference to FIGS. 11 and 12, the method shown in FIG. 14 may group all the lines PL_B1 to PL_B6 branching off from the first sub-power line PL_S1 into a group, and sense a current with respect to the first sub-power line PL_S1.

The method shown in FIG. 14 may calculate a current deviation between power lines PL (S200).

As described with reference to FIGS. 2 and 4, a current, e.g., a sensing value SV, measured in the block DVR may be provided to the power controller 700, and the power controller 700 may identify a current deviation between the power lines PL, based on the sensing value SV.

The method shown in FIG. 14 may adjust or vary a resistance of the power line PL (S300). For example, the method shown in FIG. 14 may level loads of the power lines PL. For example, in case that the current deviation is out of a reference range, the method shown in FIG. 14 may adjust or vary the resistance of the power line PL such that the current deviation is within the reference range (S300).

As described with reference to FIGS. 2 and 4, the power controller 700 may calculate a resistance value (resistance parameter or offset) for each power line PL, which is used to minimize the current deviation, and may provide the block DVR with a resistance control value RV corresponding to the resistance value. The block DVR may adjust or vary the resistance of the power line PL, based on the resistance control value RV.

The method shown in FIG. 14 may re-sense or re-measure a current of the power line PL (S400). For example, the method shown in FIG. 14 may identify whether the current deviation has been reduced according to resistance adjustment. In some embodiments, in case that the current deviation is out of the reference range in spite of the resistance adjustment, the method shown in FIG. 14 may re-adjust the resistance of the power line PL.

In embodiments, the method shown in FIG. 14 may perform current sensing and resistance adjustment in case that the display device 1 (or the display panel 100) is initially driven, in case that a specific pattern is detected, or periodically.

In an embodiment, the method shown in FIG. 14 may identify a current deviation in initial driving of the display device 1, and adjust the resistance of the power line PL.

For example, the method shown in FIG. 14 may display an image (e.g., a test image) corresponding to a specific grayscale value, a minimum grayscale value, or a maximum grayscale value in case that the display device 1 is powered on (and before the display device 1 displays a valid image), and may perform current measurement and resistance adjustment in a state in which the image is displayed.

In another embodiment, the method shown in FIG. 14 may detect a specific pattern, based on the input image data IDATA (or image data DATA), and may perform current measurement and resistance adjustment in case that the specific pattern is detected. As described above, the specific pattern may be an image pattern in which the current deviation becomes larger than the reference range. For example, the specific pattern may be a pattern in which a high-luminance image is displayed in only a specific area (or a partial area of the display panel 100).

For example, the method shown in FIG. 14 may detect a specific pattern or determine whether the specific pattern has occurred by comparing input image data IDATA of a current frame (e.g., current frame data) with input image data IDATA of a previous frame (e.g., previous frame data). In case that the specific pattern is detected, the method shown in FIG. 14 may adjust the resistance of the power line PL, based on the specific pattern. For example, the method shown in FIG. 14 may adjust the resistance by using an offset pre-set or pre-stored corresponding to the specific pattern, or may adjust the resistance by predicting a current deviation, based on the specific pattern.

In still another embodiment, the method shown in FIG. 14 may periodically measure a current of the power line PL during driving of the display device 1, may, e.g., perform current monitoring, and may perform resistance adjustment according to a monitoring result. For example, the method shown in FIG. 14 may periodically repeat the sensing of the current (S100), the calculating of the current deviation (S200), and the adjusting of the resistance (S300) (and the re-sensing of the current (S400)). A current biasing phenomenon caused by a progressive defect (e.g., a defect of a current flow path which is deteriorated as the display device 1 is driven) can be prevented.

The display device and the method for driving the display device in accordance with the embodiments of the disclosure may measure currents flowing through power lines for supplying a power voltage to the display panel, and may adjust resistances of the power lines such that a deviation between the currents is minimized (or such that the current deviation is within a reference range). Thus, a current biasing phenomenon in which a transient current flows in a specific area of the display panel and a failure (heat generation, burnt defects, or deterioration of display quality) caused by the current biasing phenomenon can be reduced or prevented.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display panel including pixels;
circuit boards including power lines electrically connected to the display panel;
a power supply that supplies a power voltage to the display panel through the power lines; and
a resistance adjuster disposed on at least one of the circuit boards, the resistance adjuster adjusting a resistance of at least one power line among the power lines such that a current deviation between the power lines is within a reference range, wherein
the resistance adjuster includes a sensing block that measures a current flowing through the at least one power line, and
the sensing block includes:
a first shunt resistor connected to a first power voltage; and
a second shunt resistor connected to a second power voltage, and
the pixels are disposed between the first shunt resistor and the second shunt resistor.

2. The display device of claim 1, wherein the resistance adjuster further includes:
a variable resistance block that adjusts the resistance of the at least one power line.

3. The display device of claim 2, wherein the variable resistance block includes a digital variable resistor.

4. The display device of claim 2, further comprising:
a power controller that calculates the current deviation between the power lines, based on the current measured by the sensing block, and calculate a resistance value of each of the power lines such that the current deviation is within the reference range,
wherein the resistance adjuster adjusts the resistance, based on the resistance value.

5. The display device of claim 1, wherein
the circuit boards include:
a printed circuit board; and
flexible films electrically connected between the printed circuit board and the display panel, and
the resistance adjuster is disposed on at least one of the flexible films.

6. The display device of claim 5, wherein
the power lines disposed on the flexible films are divided into groups, and
the resistance adjuster measures a current for each of the groups and adjusts the resistance for each of the groups.

7. The display device of claim 6, wherein the resistance adjuster adjusts each of resistances of the power lines included in one group among the groups, based on one control signal with respect to the one group.

8. The display device of claim 1, wherein
the circuit boards include:
a printed circuit board; and
flexible films electrically connected between the printed circuit board and the display panel, and
the resistance adjuster is disposed on the printed circuit board.

9. The display device of claim 1, wherein the resistance adjuster adjusts the resistance in initial driving of the display device.

10. The display device of claim 1, further comprising:
a power controller that detects a pattern in which the current deviation becomes large, based on image data, and to control the resistance adjuster to adjust the resistance, based on the pattern.

11. The display device of claim 1, wherein the resistance adjuster periodically adjusts the resistance during driving of the display device.

12. A method for driving a display device, the method comprising:
sensing a current flowing through at least one power line among power lines disposed on circuit boards between a power supply and a display panel including pixels;
calculating a current deviation between power lines, based on the sensed current; and
adjusting a resistance of the at least one power line among the power lines such that the current deviation is within a reference range, wherein
the sensing of the current includes:
measuring a first voltage between opposite ends of a first shunt resistor connected to a first power voltage, and
measuring a second voltage between opposite ends of a second shunt resistor connected to a second power voltage, and
the pixels are disposed between the first shunt resistor and the second shunt resistor.

13. The method of claim 12, further comprising:
re-sensing a current flowing through the at least one power line among the power lines, after the adjusting of the resistance.

14. The method of claim 12, wherein
the power lines disposed on flexible films between the power supply and the display panel are divided into groups, and
the sensing of the current includes sensing the current for each of the groups.

15. The method of claim 12, wherein, in the sensing of the current, the current is sensed in initial driving of the display device.

16. The method of claim 12, further comprising:
detecting a pattern in which the current deviation becomes larger than the reference range, based on image data; and
adjusting the resistance, based on the pattern.

17. The method of claim 12, further comprising:
periodically repeating the sensing of the current, the calculating of the current deviation, and the adjusting of the resistance.

18. The method of claim 14, the adjusting of the resistance of the at least one power line among the power lines includes measuring a current for each of the groups.

19. The method of claim 18, wherein the adjusting of the resistance of the at least one power line among the power lines further includes adjusting each of resistances of the power lines included in one group among the groups, based on one control signal with respect to the one group.

20. The display device of claim 1, wherein the sensing block includes:

a first sensing circuit that measures a first voltage between opposite ends of the first shunt resistor, and a second sensing circuit that measures a second voltage between opposite ends of the second shunt resistor.

\* \* \* \* \*